(12) United States Patent
Song et al.

(10) Patent No.: US 9,001,579 B2
(45) Date of Patent: Apr. 7, 2015

(54) SEMICONDUCTOR MEMORY DEVICE FOR AND METHOD OF APPLYING TEMPERATURE-COMPENSATED WORD LINE VOLTAGE DURING READ OPERATION

(71) Applicant: Samsung Electronics Co., Ltd, Suwon-si, Gyeonggi-do (KR)

(72) Inventors: Young-Sun Song, Hwaseong-si (KR); Eung-Suk Lee, Seongnam-si (KR); Il-Han Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/058,508

(22) Filed: Oct. 21, 2013

(65) Prior Publication Data

US 2014/0140130 A1     May 22, 2014

(30) Foreign Application Priority Data

Nov. 21, 2012   (KR) ........................ 10-2012-0132420

(51) Int. Cl.
| | | |
|---|---|---|
| G11C 16/04 | (2006.01) | |
| G11C 16/08 | (2006.01) | |
| G11C 16/26 | (2006.01) | |
| G11C 7/04 | (2006.01) | |
| G11C 11/56 | (2006.01) | |

(52) U.S. Cl.
CPC ................ G11C 16/08 (2013.01); G11C 16/26 (2013.01); *G11C 11/5628* (2013.01); *G11C 11/5621* (2013.01); G11C 7/04 (2013.01); *G11C 11/5642* (2013.01)

(58) Field of Classification Search
CPC ........... G11C 11/5628; G11C 11/5642; G11C 11/5621
USPC ............. 365/185.03, 185.17, 185.23, 185.25, 365/211
See application file for complete search history.

(56) References Cited

U.S. PATENT DOCUMENTS

| | | | |
|---|---|---|---|
| 6,205,074 B1 * | 3/2001 | Van Buskirk et al. ........ | 365/211 |
| 6,870,766 B2 | 3/2005 | Cho et al. | |
| 6,954,394 B2 * | 10/2005 | Knall et al. .................... | 365/211 |
| 7,187,610 B1 * | 3/2007 | McCollum et al. ........... | 365/222 |
| 7,719,888 B2 | 5/2010 | Han | |
| 7,755,946 B2 | 7/2010 | Dunga et al. | |
| 8,081,508 B2 * | 12/2011 | Kim et al. ................. | 365/185.03 |
| 8,120,952 B2 | 2/2012 | Han | |
| 2013/0194872 A1 * | 8/2013 | Sim et al. .................. | 365/185.17 |

FOREIGN PATENT DOCUMENTS

| | | |
|---|---|---|
| KR | 10-0476888 | 3/2005 |
| KR | 10-2009-0124101 | 3/2009 |
| KR | 10-2011-0031330 | 3/2011 |
| WO | 2009-154674 | 12/2009 |

* cited by examiner

*Primary Examiner* — Connie Yoha
(74) *Attorney, Agent, or Firm* — Ellsworth IP Group PLLC

(57) ABSTRACT

A semiconductor memory device configured to apply a temperature-compensated word line voltage to a word line during a data read operation includes a memory cell array including a plurality of word lines, a plurality of non-volatile memory cells connected to the word lines, and a word line voltage application unit configured to apply a temperature-compensated read voltage to a selected word line and to apply a temperature-compensated pass voltage to at least one unselected word line during a read operation.

18 Claims, 9 Drawing Sheets

SEMICONDUCTOR MEMORY DEVICE FOR AND METHOD OF APPLYING TEMPERATURE-COMPENSATED WORD LINE VOLTAGE DURING READ OPERATION

CROSS-REFERENCE TO RELATED APPLICATIONS

This application claims benefit under 35 U.S.C. §119 to Korean Patent Application No. 10-2012-0132420, filed on Nov. 21, 2012, the content of which is incorporated herein in its entirety by reference.

BACKGROUND

1. Field

Embodiments of the inventive concept relate to a semiconductor memory device, more particularly, to a semiconductor memory device configured to apply a temperature-compensated word line voltage to a word line during a data read operation.

2. Description of the Related Art

A variation in a threshold voltage Vth of a flash memory cell may occur due to a variation in temperature.

Accordingly, during a verification read operation or a normal read operation, a temperature-compensated read voltage is applied to a selected word line to compensate for the variation in the threshold voltage relative to the temperature to obtain data information stored in a memory cell.

When a temperature compensation operation is not performed, error bits may increase, causing failures.

FIG. 1 is a diagram for explaining a variation in a threshold voltage of a memory cell according to a variation in temperature in a typical semiconductor memory device.

Memory cells connected to an arbitrary word line WLa may include programmed memory cells. The programmed memory cells may have threshold voltages, which are characterized by a threshold voltage distribution denoted by a solid curve L1, at a default temperature. In this case, the threshold voltages of the memory cells characterized by the threshold voltage distribution L1 may be determined by a read voltage V1 during a normal read operation, and by a verification read voltage V2 during a verification read operation.

The threshold voltage distribution L1 may be changed into a threshold voltage distribution denoted by a dotted curve L2, due to a variation in temperature from the default temperature. In this case, threshold voltages of memory cells characterized by the threshold voltage distribution L2 may be determined by a temperature-compensated read voltage V1' during a normal read operation, and by a temperature-compensated verification read voltage V2' during a verification read operation.

SUMMARY

Embodiments of the inventive concept provide a semiconductor memory device configured to reduce data read errors due to a variation in temperature during a data read operation.

Other embodiments of the inventive concept provide a method of applying a word line voltage, by which data read errors due to a variation in temperature may be reduced during the data read operation of the semiconductor memory device.

Additional features and utilities of the present inventive concept will be set forth in part in the description which follows and, in part, will be obvious from the description, or may be learned by practice of the inventive concept.

The foregoing and/or other features and utilities of the present general inventive concept may be achieved by providing a semiconductor memory device including a memory cell array having a plurality of word lines, and a plurality of non-volatile memory cells connected to the word lines, and a word line voltage application unit configured to apply a temperature-compensated read voltage to a selected word line and to apply a temperature-compensated pass voltage to at least one unselected word line during a read operation.

The word line voltage application unit may include a word line voltage generator configured to detect the temperature and to output the temperature-compensated read voltage and the temperature-compensated pass voltage corresponding to the detected temperature, and a row decoder configured to apply the read voltage to the selected word line and to apply the pass voltage to the at least one unselected word line.

The word line voltage generator may include a temperature detector configured to detect a temperature, a first lookup table configured to store first temperature compensation data for temperature-compensating a pass voltage according to the temperature, a second lookup table configured to store second temperature compensation data for temperature-compensating a read voltage according to the temperature, a compensator configured to read the first temperature compensation data and the second temperature compensation data corresponding to the detected temperature, and to output a pass voltage compensation signal corresponding to the first temperature compensation data and a read voltage compensation signal corresponding to the second temperature compensation data, a pass voltage generator configured to output the pass voltage corresponding to the pass voltage compensation signal, and a read voltage generator configured to output the read voltage corresponding to the read voltage compensation signal.

The plurality of non-volatile memory cells may have n threshold voltage levels. The word line voltage application unit may apply a temperature-compensated first-level read voltage and may continue sequentially through increasing level orders until the word line voltage application unit may apply a temperature-compensated n-th-level read voltage to the selected word line, and may apply the temperature-compensated pass voltage to the at least one unselected word line.

The plurality of non-volatile memory cells may have n threshold voltage levels. The second temperature compensation data may include temperature compensation data set at respective levels. The compensator may output a pass voltage compensation signal corresponding to the first temperature compensation data, and may output a read voltage compensation signal in a sequence starting with a read voltage compensation signal corresponding to a first-level second temperature compensation data and ending with a read voltage compensation signal corresponding to an n-th-level second temperature compensation data.

The plurality of non-volatile memory cells may have n threshold voltage levels. The word line voltage application unit may, in a sequence, apply a temperature-compensated read voltage to the selected word line and a temperature-compensated pass voltage to the at least one unselected word line starting with a temperature-compensated first-level read voltage and a temperature-compensated first-level pass voltage and ending with a temperature-compensated n-th-level read voltage and a temperature-compensated n-th-level pass voltage.

The plurality of non-volatile memory cells may have n threshold voltage levels. The first temperature compensation data may include temperature compensation data set at respective levels. The second temperature compensation data may include temperature compensation data set at respective levels. The compensator may, in a sequence, output a pass voltage compensation signal corresponding to a first-level first temperature compensation data and a read voltage compensation signal corresponding to a first-level second temperature compensation data and ending with a pass voltage compensation signal corresponding to an n-th-level first temperature compensation data and a read voltage compensation signal corresponding to an n-th-level second temperature compensation data.

The memory cell array may include a NAND-type flash memory cell array.

The foregoing and/or other features and utilities of the present general inventive concept may also be achieved by providing a semiconductor memory device including a memory cell array having a plurality of word lines and a plurality of non-volatile memory cells connected to the plurality of word lines, and a word line voltage application unit configured to apply, in a first mode, a temperature-compensated read voltage to a selected word line and to apply, in a second mode during a read operation, a temperature-compensated read voltage to a selected word line and a temperature-compensated pass voltage to at least one unselected word line.

The first mode may be a state in which an error detection rate of read data is less than a predetermined rate, and the second mode may be a state in which the error detection rate of the read data is equal to or more than the predetermined rate.

The word line voltage application unit may include an error correction circuit configured to detect errors from the read data, a word line voltage generator configured to detect a temperature, to output, in the first mode, a temperature-compensated read voltage corresponding to the detected temperature and, in the second mode, the temperature-compensated read voltage and a temperature-compensated pass voltage corresponding to the detected temperature, and a row decoder configured to apply the temperature-compensated read voltage to the selected word line and the temperature-compensated pass voltage to the at least one unselected word line.

The plurality of non-volatile memory cells may have n threshold voltage levels. The word line voltage application unit may, in the first mode, apply a temperature-compensated read voltage to the selected word line in a sequence starting with a temperature-compensated first-level read voltage and ending with a temperature-compensated n-th-level read voltage.

The word line voltage application unit may, in a second mode, apply the temperature-compensated pass voltage to the at least one unselected word line and the temperature-compensated read voltage to the selected word line in a sequence starting with the temperature-compensated first-level read voltage and ending with the temperature-compensated n-th-level read voltage.

The word line voltage application unit may, in the second mode, apply the temperature-compensated read voltage to the selected word line and the temperature-compensated pass voltage to the at least one unselected word line in a sequence starting with the temperature-compensated first-level read voltage and a temperature-compensated first-level pass voltage and ending with the temperature-compensated n-th-level read voltage and a temperature-compensated n-th-level pass voltage.

The foregoing and/or other features and utilities of the present general inventive concept may also be achieved by providing a method of performing a read operation, the method including applying, from a circuit during the read operation, a read voltage to a selected word line of a multi-level memory cell and applying, from the circuit during the read operation, a pass voltage to at least one unselected word line of the multi-level memory cell. The read voltage may be compensated for a temperature of the multi-level memory cell. The pass voltage may be compensated for the temperature.

The read voltage may comprise a first read voltage corresponding to a first level of the multi-level memory cell and a second read voltage corresponding to a second level of the multi-level memory cell and may be applied in applied in a sequence in which the first read voltage is followed by the second read voltage.

The pass voltage may comprise a first pass voltage corresponding to the first level and a second pass voltage corresponding to the second level and may be applied in the sequence in which the first pass voltage is followed by the second pass voltage.

The pass voltage may be applied only if a rate of error bits in data from the multi-level memory cell exceeds a predetermined rate.

The method may also include producing, at the circuit, the read voltage from a temperature-compensated read voltage signal, producing, at the circuit, the temperature-compensated read voltage signal from first temperature compensation data corresponding to the temperature and a threshold voltage corresponding to the multi-level memory cell, producing, at the circuit, the pass voltage from a temperature-compensated pass voltage signal, and producing, at the circuit, the temperature-compensated pass voltage signal from second temperature compensation data corresponding to the temperature.

BRIEF DESCRIPTION OF THE DRAWINGS

The foregoing and other features and utilities of the inventive concepts will be apparent from the more particular description of exemplary embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE PREFERRED EMBODIMENTS

Figure 1:
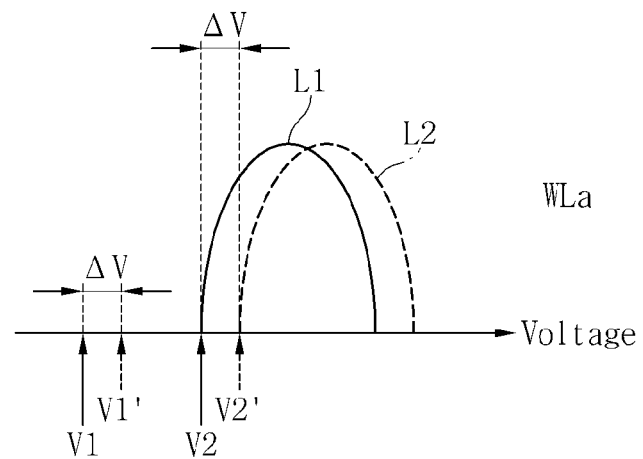
FIG. 1 is a graph illustrating a variation in a threshold voltage of a memory cell due to a variation in temperature in a typical semiconductor device.

Embodiments of the inventive concept are described below in sufficient detail to enable those of ordinary skill in the art to embody and practice the inventive concept. It is important to understand that the inventive concept may be embodied in many alternate forms and should not be construed as limited to the embodiments set forth herein.

Accordingly, while the inventive concept can be modified in various ways and take on various alternative forms, specific embodiments thereof are shown in the drawings and described in detail below as examples. There is no intent to limit the inventive concept to the particular forms disclosed. On the contrary, the inventive concept is to cover all modifications, equivalents, and alternatives falling within the spirit and scope of the appended claims.

It will be understood that, although the terms first, second, A, B, etc. may be used herein in reference to elements of the inventive concept, such elements should not be construed as limited by these terms. For example, a first element could be termed a second element, and a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

Reference will now be made in detail to the embodiments of the present inventive concept, examples of which are illustrated in the accompanying drawings, wherein like reference numerals refer to the like elements throughout. The embodiments are described below in order to explain the present inventive concept while referring to the figures.

Figure 2:
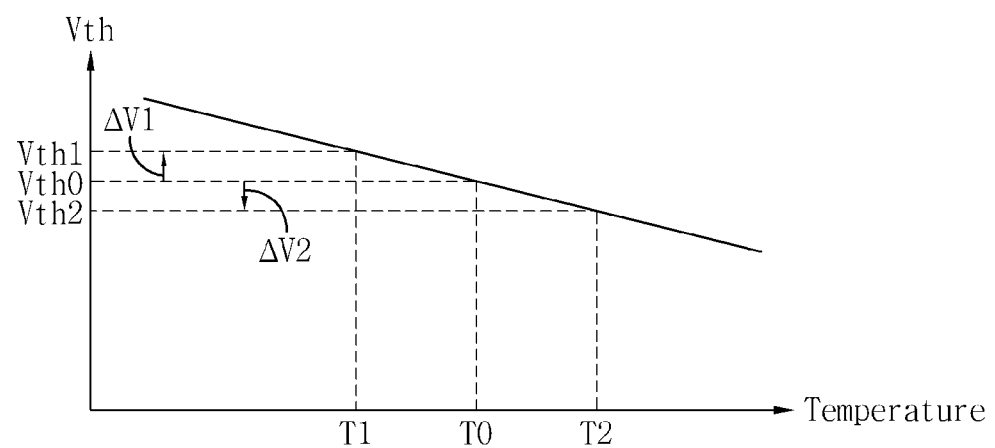
FIG. 2 is a graph illustrating a variation in a threshold voltage of a memory cell as a function of temperature, according to an embodiment of the inventive concept.

FIG. 2 is a graph illustrating a threshold voltage Vth of a memory cell as a function of temperature, according to an embodiment of the inventive concept.

Due to characteristics of a memory cell, a threshold voltage Vth may be reduced with a rise in temperature, and may be increased with a drop in temperature.

Accordingly, to read memory data from a memory cell connected to a selected word line, a read voltage, compensated for the temperature, may be applied to the selected word line.

When a current temperature is a temperature T1 that is lower than a default temperature T0, the threshold voltage Vth of the memory cell may be increased to a threshold voltage Vth1 that is higher than a default threshold voltage Vth0. In this case, a compensated read voltage may be obtained by adding a threshold voltage increment ΔV1 to a default read voltage. The compensated read voltage may then be applied to the selected word line.

When the current temperature is a temperature T2 that is higher than the default temperature T0, the threshold voltage Vth of the memory cell may be reduced to a threshold voltage Vth2 that is lower than the default threshold voltage Vth0. In this case, a compensated read voltage may be obtained by adding a threshold voltage decrement ΔV2 (which has a negative value) to the default read voltage. The compensated read voltage may then be applied to the selected word line.

A compensation added to the default read voltage to compensate for temperature may be equal to the threshold voltage increment ΔV1 or the threshold voltage decrement ΔV2, but the inventive concept is not limited thereto. For example, a compensation that increases or decreases in a predetermined proportion with a variation in temperature may be added to the default read voltage.

Figure 3A:
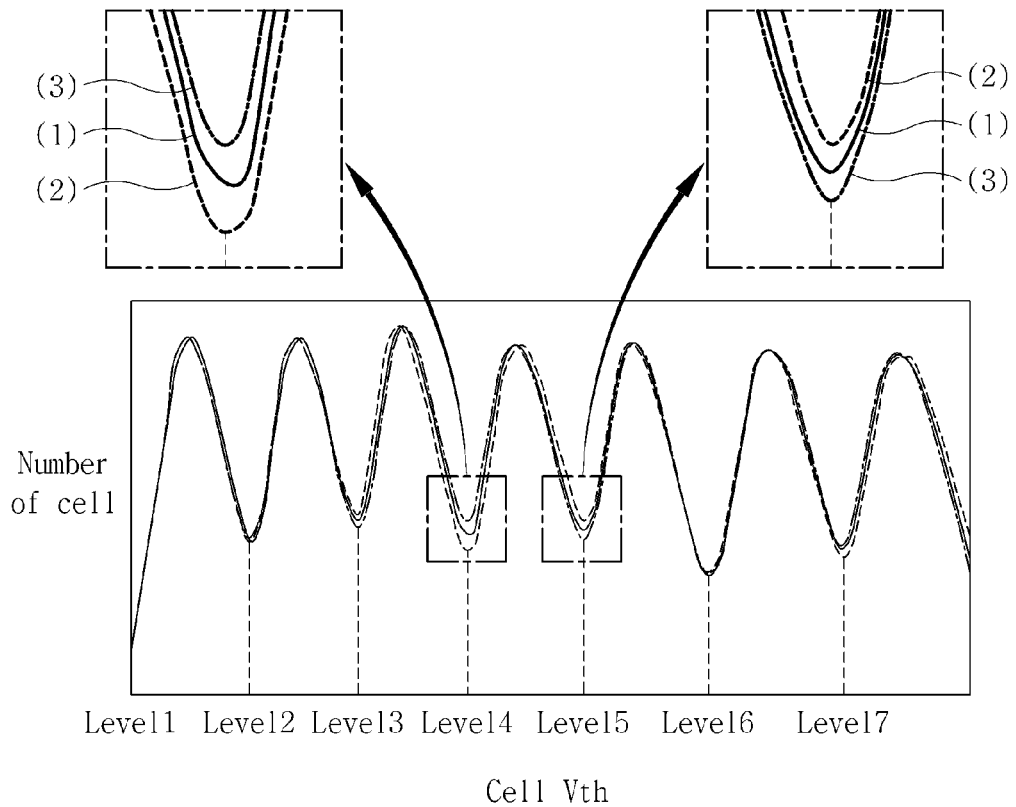
FIG. 3A is a diagram illustrating a threshold voltage dispersion curve of a memory cell connected to a selected word line when a temperature-compensated pass voltage is applied to unselected word lines, according to an embodiment of the inventive concept.

FIG. 3A is a diagram illustrating a threshold voltage dispersion curve of a memory cell connected to a selected word line when a temperature-compensated pass voltage is applied to unselected word lines, according to an embodiment of the inventive concept.

Figure 3B:
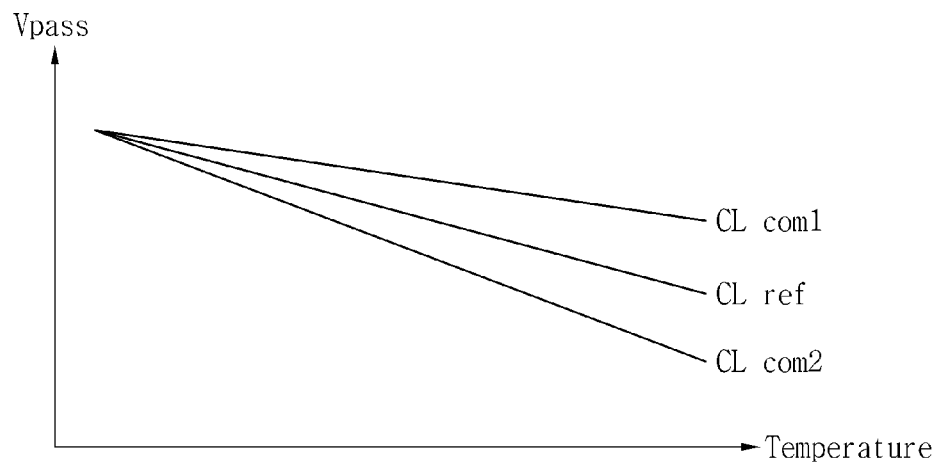
FIG. 3B is a graph illustrating a pass voltage compensation line applied to an unselected word line corresponding to the threshold voltage dispersion curve of FIG. 3A.

FIG. 3B is a graph illustrating a pass voltage compensation line applied to an unselected word line corresponding to the threshold voltage dispersion curve of FIG. 3A.

FIG. 3A illustrates a case in which the memory cell is a 7-level memory cell.

In FIG. 3A, a solid curve (1) denotes a reference threshold voltage dispersion curve that corresponds to a reference line CLref of FIG. 3B, a dotted curve (2) denotes a first comparative threshold voltage dispersion curve that corresponds to a first comparative line CLcom1 of FIG. 3B, and an alternating long-short dashed curve (3) denotes a second comparative threshold voltage dispersion curve that corresponds to a second comparative line CLcom2 of FIG. 3B.

In the three threshold voltage dispersion curves (1), (2), and (3) of FIG. 3A, in comparing depths of valleys corresponding to Level 4, it can be seen that the depth of the valley of the reference threshold voltage dispersion curve (1) may be greater than the depth of the valley of the first comparative threshold voltage dispersion curve (2).

Therefore, it can be concluded that when a pass voltage, compensated according to the first comparative line CLcom1, is applied to unselected word lines while a 4-level read voltage is applied to a selected word line, the dispersion of threshold voltages may be improved to reduce the occurrence of error bits.

In addition, in comparing the depths of the valleys corresponding to Level 5 in the three threshold voltage dispersion curves (1), (2), and (3) of FIG. 3A, it can be seen that the depth of the valley of the second comparative threshold voltage dispersion curve (3) is greater than the depth of the valley of the reference threshold voltage dispersion curve (1).

Therefore, it can be concluded that when a pass voltage, compensated according to the second comparative line CLcom2, is applied to the unselected word lines while a 5-level read voltage is applied to the selected word line, the dispersion of threshold voltages may be improved to reduce the occurrence of error bits.

In the present inventive concept, when a pass voltage is applied to unselected word lines during a data read operation, while read voltages corresponding to respective levels of a multi-level memory cell are sequentially applied to a selected word line, a temperature-compensated pass voltage, provided by a single pass voltage compensation line, may be applied to the unselected word lines irrespective of the read voltages corresponding to the respective levels that are applied to the selected word line.

Furthermore, to minimize the occurrence of error bits, when read voltages corresponding to respective levels of a multi-level memory cell are sequentially applied to a selected word line, a temperature-compensated pass voltage, provided by a corresponding pass voltage compensation line, may be applied to a corresponding unselected word line for a corresponding level of the multi-level memory cell such that temperature-compensated pass voltages are applied to unselected word lines for all levels of the multi-level memory cell.

Figure 4A:
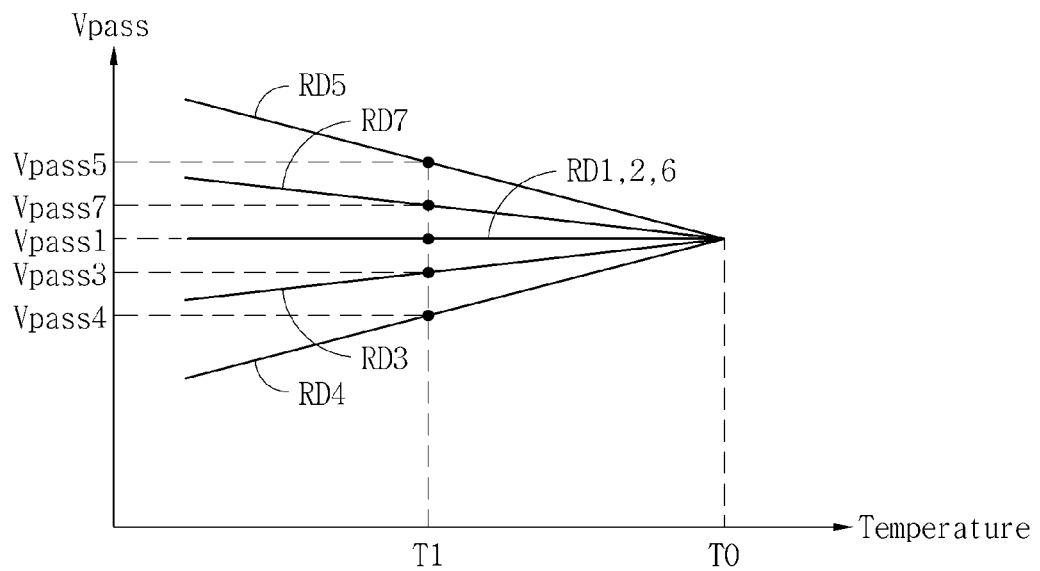
FIG. 4A is a graph illustrating a pass voltage compensation line corresponding to each level of a multi-level memory cell, according to an embodiment of the inventive concept.

FIG. 4A is a graph illustrating a pass voltage compensation line corresponding to each level of a multi-level memory cell, according to an embodiment of the inventive concept.

FIG. 4A illustrates a pass voltage compensation line corresponding to each level of a 7-level memory cell. In the example illustrated in FIG. 4A, a first-level pass voltage compensation line RD1, a second-level pass voltage compensation line RD2, and a sixth-level pass voltage compensation line RD6 may be the same pass voltage compensation line.

Here, an n-th-level pass voltage compensation line refers to a pass voltage applied to unselected word lines for a given temperature when an n-th-level read voltage is applied to a selected word line.

In FIG. 4A, the smallest slope may be associated with the fifth-level pass voltage compensation line RD5, followed by the seventh-level pass voltage compensation line RD7, the first-level pass voltage compensation line RD1, the third-level pass voltage compensation line RD3, and finally the fourth-level pass voltage compensation line RD4. The smallest slope may, for example, be a negative slope with the largest slope magnitude.

In the cases of the fifth- and seventh-level pass voltage compensation lines RD5 and RD7, these may have negative slopes because their corresponding pass voltages are reduced with a rise in temperature. In the case of the first-level pass voltage compensation line RD1, it may have a slope of zero because its corresponding pass voltage remains constant during changes in temperature. In the cases of the third- and fourth-level pass voltage compensation lines RD3 and RD4, these may have positive slopes because their corresponding pass voltages are increased with a rise in temperature.

In FIG. 4A, in a case in which the semiconductor memory device is maintained at a temperature T1, when a first-level read voltage, a second-level read voltage, and a sixth-level read voltage are applied to a selected word line, a pass voltage Vpass1 may be applied to unselected word lines. When a third-level read voltage is applied to the selected word line, a pass voltage Vpass3 may be applied to the unselected word lines. When a fourth-level read voltage is applied to the selected word line, a pass voltage Vpass4 may be applied to the unselected word lines. When a fifth-level read voltage is applied to the selected word line, a pass voltage Vpass5 may be applied to the unselected word lines. When a seventh-level read voltage is applied to the selected word line, a pass voltage Vpass7 may be applied to the unselected word lines.

Furthermore, at reference temperature T0, all of the pass voltage compensation lines have the same pass voltage, Vpass1.

Figure 4B:
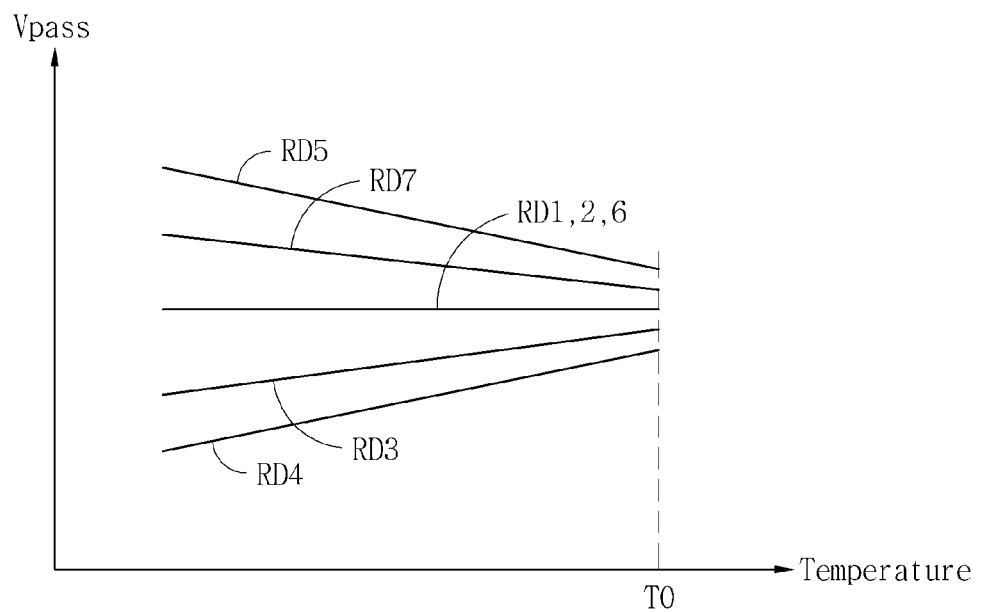
FIG. 4B is a graph illustrating a pass voltage compensation line corresponding to each level of a multi-level memory cell, according to an embodiment of the inventive concept.

In an embodiment, as shown in FIG. 4B, the pass voltage compensation lines may have different pass voltages at reference temperature T0.

These characteristics of the pass voltage compensation lines may be individually determined for each chip depending on the semiconductor memory production environment.

In an embodiment, a temperature-compensated pass voltage may not be applied to all unselected word lines, but may be applied only to at least one specific unselected word line of the set of unselected word lines. For example, a temperature-compensated pass voltage may be applied to the word line disposed most adjacent to the selected word line on each side of the selected word line, or to a specific number of word lines disposed adjacent to the selected word line on each side of the selected word line.

Figure 5:
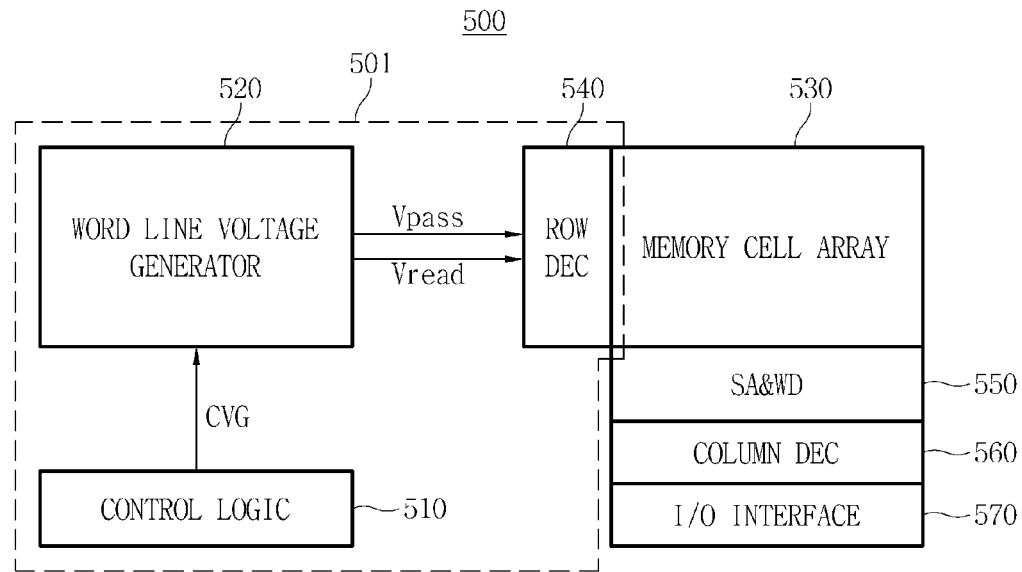
FIG. 5 is a schematic block diagram illustrating a semiconductor memory device, according to an embodiment of the inventive concept.

FIG. 5 is a schematic block diagram illustrating a semiconductor memory device 500, according to an embodiment of the inventive concept.

Referring to FIG. 5, the semiconductor memory device 500 may include a control logic 510, a word line voltage generator 520, a memory cell array 530, a row decoder 540, a sense amplifier and write driver circuit 550, a column decoder 560, and an input/output (I/O) interface 570. The semiconductor memory device 500 may, for example, be a flash memory device.

The control logic 510 may output a voltage generation control signal CVG to the word line voltage generator 520 in response to a read command.

In response to the voltage generation control signal CVG, the word line voltage generator 520 may output, to the row decoder 540, a temperature-compensated pass voltage Vpass and a temperature-compensated read voltage Vread.

The memory cell array 530 may include a plurality of word lines and a plurality of bit lines, and may also include a plurality of memory cells connected to the word lines and the bit lines. The memory cell array 530 may, for example, be a NAND-type cell array. Each of the memory cells may, for example, be a multi-level memory cell having n threshold voltage levels.

In response to a row address, the row decoder 540 may apply a read voltage Vread to a selected word line, and may apply a pass voltage Vpass to all or specific ones of unselected word lines.

The sense amplifier and write driver circuit 550 may be configured to read data from the memory cell array 530 during a read operation, and configured to write data in the memory cell array 530 during a program operation. The sense amplifier and write driver circuit 550 may, for example, be referred to as a known page buffer circuit.

The column decoder 560 may be configured to select the data read by the sense amplifier and write driver circuit 550 in predetermined units (e.g., byte units).

The I/O interface 570 may externally transmit the data selected by the column decoder 560.

The control logic 510, the word line voltage generator 520, and the row decoder 540 may constitute a word line voltage application unit 501, which may apply the temperature-compensated read voltage Vread to the selected word line and the temperature-compensated pass voltage Vpass to the unselected word lines during a program verification read operation or a normal read operation.

Figure 6:
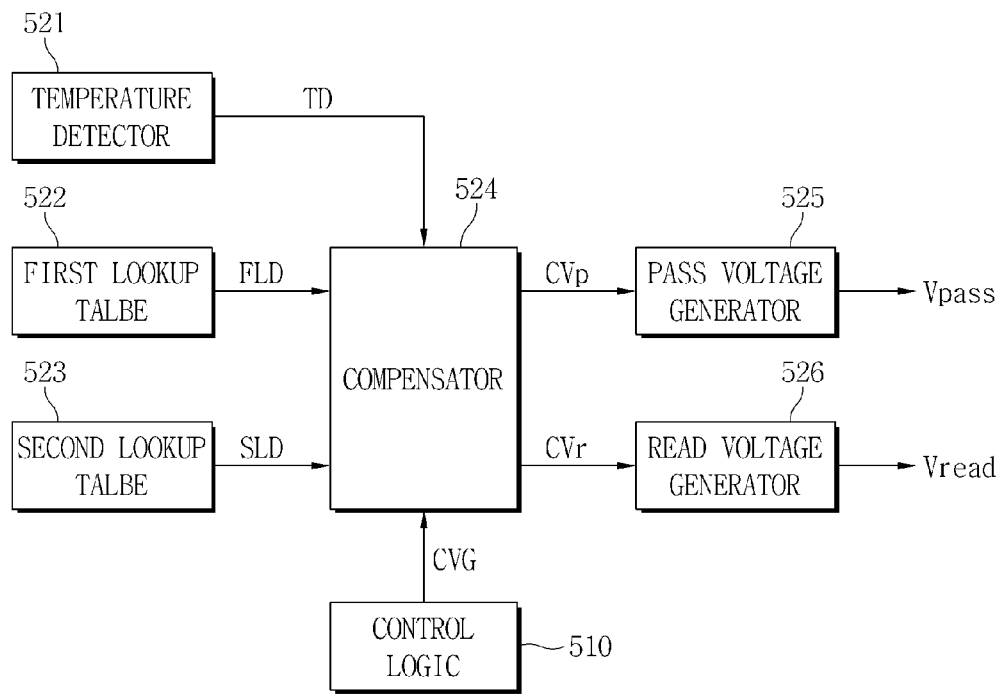
FIG. 6 is a schematic block diagram illustrating a word line voltage generator of FIG. 5.

FIG. 6 is a schematic block diagram illustrating the word line voltage generator 520 of FIG. 5.

Referring to FIG. 6, the word line voltage generator 520 may include a temperature detector 521, a first lookup table 522, a second lookup table 523, a compensator 524, a pass voltage generator 525, and a read voltage generator 526.

The temperature detector 521 may detect a current temperature of the memory device 500 and may output temperature data TD, corresponding to the detected temperature, to the compensator 524.

The first lookup table 522 may store first temperature compensation data FLD corresponding to the pass voltage Vpass applied to the unselected word line.

The first lookup table 522 may store single first temperature compensation data FLD irrespective of a level of a read voltage Vread applied to a selected word line, or may store the first temperature compensation data FLD determined at respective levels to correspond to respective level read voltages Vread applied to the selected word line.

The second lookup table 523 may store second temperature compensation data SLD corresponding to a read voltage Vread applied to the selected word line at respective threshold voltage levels.

The compensator 524 may receive the temperature data TD, may read the first temperature compensation data FLD, corresponding to the temperature data TD, from the first lookup table 522, and may read the second temperature compensation data SLD, corresponding to the temperature data TD, from the second lookup table 523.

In an embodiment, in response to the voltage generation control signal CVG output by the control logic 510, the compensator 524 may output a pass voltage compensation signal CVp, corresponding to the first temperature compensation data FLD, as a constant value irrespective of threshold voltage levels of memory cells, and may sequentially output read voltage compensation signals CVr, corresponding to the second temperature compensation data SLD, in the order of the threshold voltage levels.

In an embodiment, in response to the voltage generation control signal CVG output by the control logic 510, the compensator 524 may sequentially output pass voltage compensation signals CVp, corresponding to the first temperature compensation data FLD, in the order of threshold voltage levels, and may sequentially output read voltage compensation signals CVr, corresponding to the second temperature compensation data SLD, in the order of the threshold voltage levels. For example, in response to the voltage generation control signal CVG, after the compensator 524 outputs a pass voltage compensation signal CVp and a read voltage compensation signal CVr corresponding to a first level, the compensator 524 may output a pass voltage compensation signal CVp and a read voltage compensation signal CVr corresponding to a second level. In the above-described manner, the compensator 524 may output the pass voltage compensation signal CVp and the read voltage compensation signal CVr corresponding to the first level and may continue sequentially through increasing level orders until the compensator 524 may output a pass voltage compensation signal CVp and a read voltage compensation signal CVr corresponding to an n-th level.

The pass voltage generator 525 may generate and output a pass voltage Vpass corresponding to the pass voltage compensation signal CVp.

The read voltage generator 526 may generate and output a read voltage Vread corresponding to the read voltage compensation signal CVr.

Figure 7:
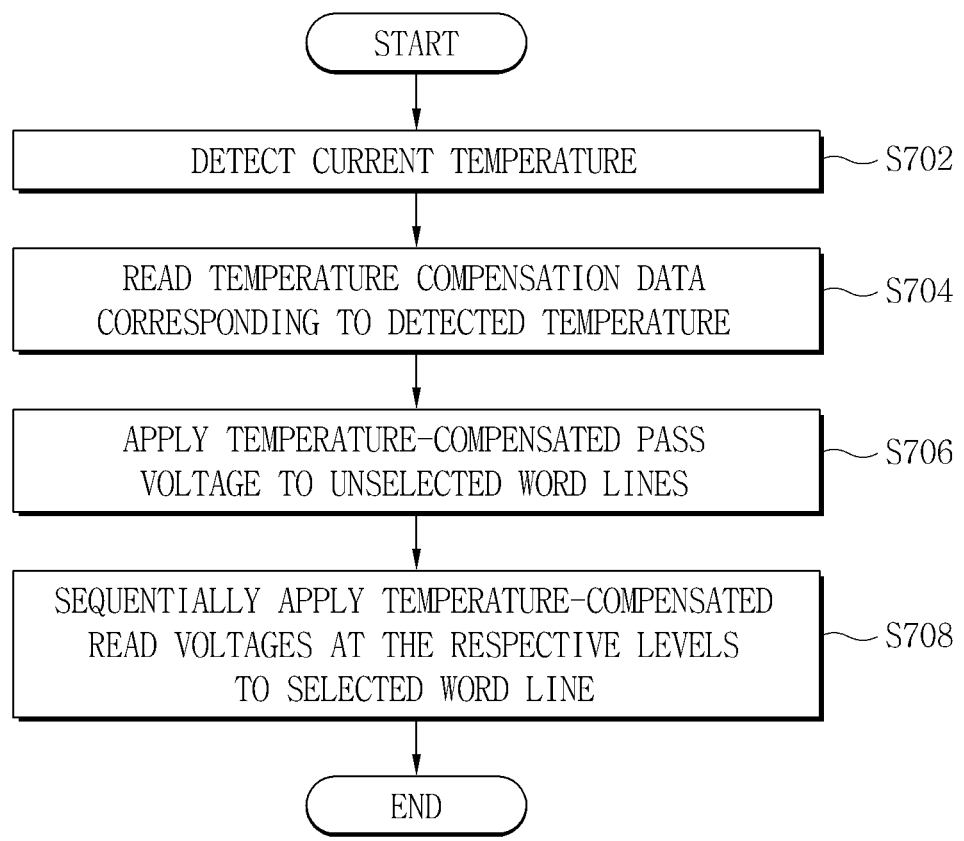
FIG. 7 is a flowchart illustrating a method of applying a word line voltage to a word line during a read operation, according to an embodiment of the inventive concept.

FIG. 7 is a flowchart illustrating a method of applying a word line voltage to a word line during a read operation, according to an embodiment of the inventive concept.

Referring to FIGS. 5, 6, and 7, initially, the temperature detector 521 may detect a current temperature TD of the memory device 500 (operation S702).

Next, the compensator 524 may read, from the first lookup table 522, first temperature compensation data FLD corresponding to the detected current temperature TD and may read, from the second lookup table 523, second temperature compensation data SLD set at respective levels (operation S704).

Next, the compensator 524 may output a pass voltage compensation signal CVp corresponding to the first temperature compensation data FLD, the pass voltage generator 525 may output a pass voltage Vpass corresponding to the pass voltage compensation signal CVp, and the row decoder 540 may apply the pass voltage Vpass to unselected word lines (operation S706).

Next, the compensator 524 may sequentially output respective-level read voltage compensation signals CVr corresponding to respective-level second temperature compensation data SLD at respective levels, the read voltage generator 526 may sequentially output read voltages Vread corresponding to the respective-level read voltage compensation signals CVr at the respective levels, and the row decoder 540 may sequentially apply the read voltages Vread to a selected word line at the respective levels (operation S708).

Figure 8:
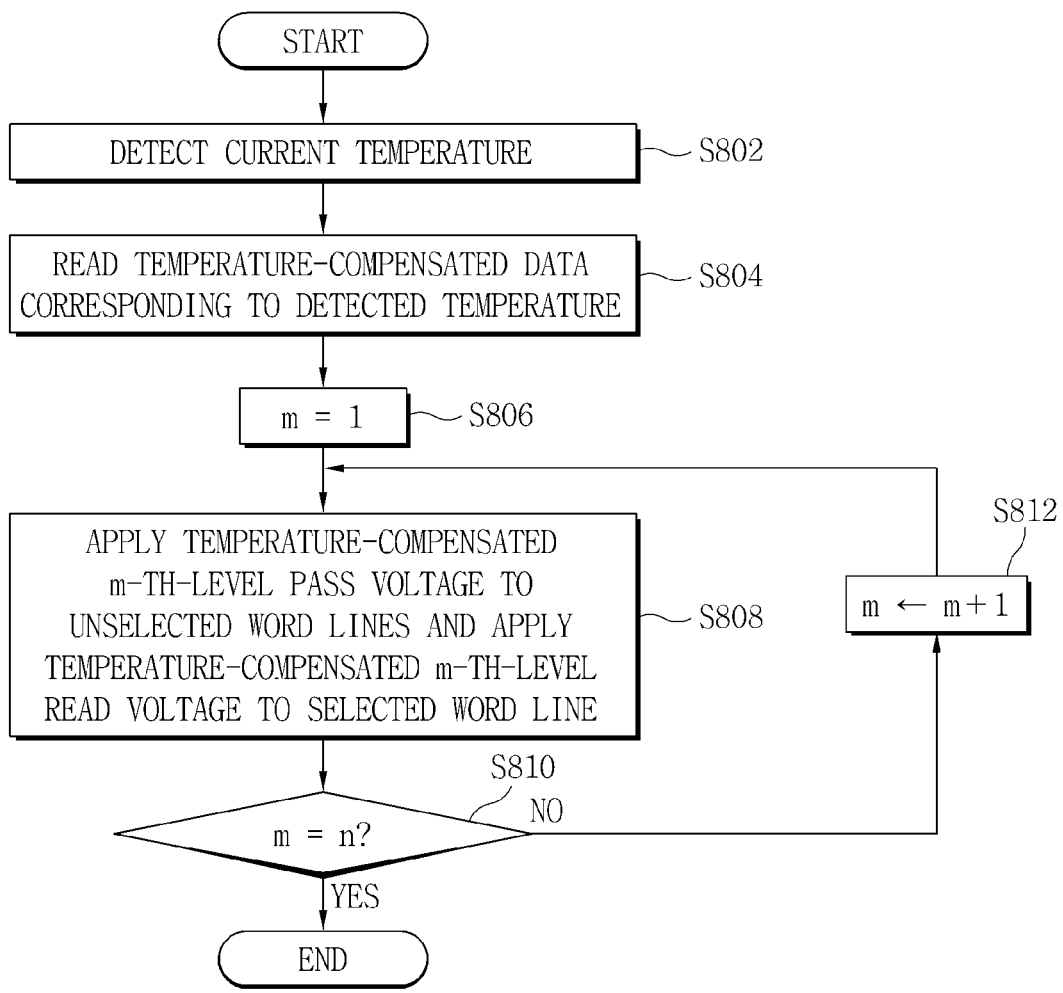
FIG. 8 is a flowchart illustrating a method of applying a word line voltage to a word line during a read operation, according to an embodiment of the inventive concept.

FIG. 8 is a flowchart illustrating a method of applying a word line voltage to a word line during a read operation, according to an embodiment of the inventive concept.

Referring to FIGS. 5, 6, and 8, initially, the temperature detector 521 may detect a current temperature TD of the memory device 500 (operation S802).

Next, the compensator 524 may read, from the first lookup table 522, respective-level first temperature compensation data FLD corresponding to the detected current temperature TD and may read, from the second lookup table 523, respective-level second temperature compensation data SLD (operation S804).

Next, the compensator 524 may output an m-th-level pass voltage compensation signal CVp corresponding to m-th-level first temperature compensation data FLD, and an m-th-level read voltage compensation signal CVr corresponding to m-th-level second temperature compensation data SLD, the pass voltage generator 525 and the read voltage generator 526 may output an m-th-level pass voltage Vpass corresponding to the m-th-level pass voltage compensation signal CVp and an m-th-level read voltage Vread corresponding to the m-th-level read voltage compensation signal CVr, and the row decoder 540 may apply an m-th-level pass voltage Vpass to unselected word lines and apply an m-th-level read voltage Vread to a selected word line (operation S808). This operation S808 of applying a word line voltage at each level may be performed from a first level to an n-th level in sequential order (operations S806, S810, and S812).

Figure 9:
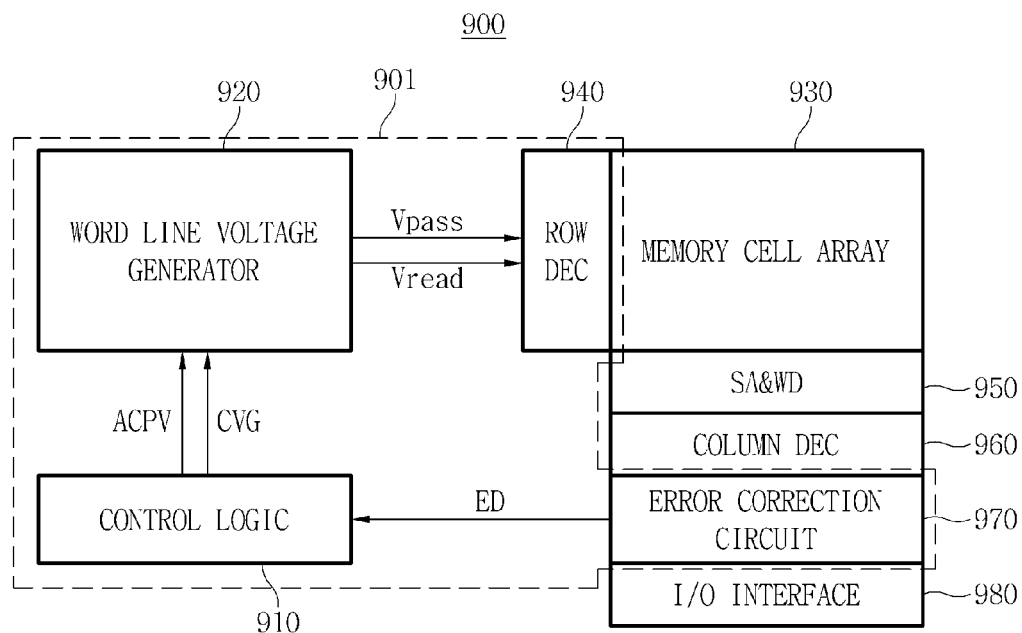
FIG. 9 is a schematic block diagram illustrating a semiconductor memory device, according to an embodiment of the inventive concept.

FIG. 9 is a schematic block diagram illustrating a semiconductor memory device 900, according to an embodiment of the inventive concept.

Referring to FIG. 9, the semiconductor memory device 900 may include a control logic 910, a word line voltage generator 920, a memory cell array 930, a row decoder 940, a sense amplifier and write driver circuit 950, a column decoder 960, an error correction circuit 970, and an I/O interface 980. The semiconductor memory device 900 may, for example, be a flash memory device.

The control logic 910 may output a voltage generation control signal CVG to the word line voltage generator 920 in response to a read command, receive an error detection signal ED from the error correction circuit 970, and output a pass voltage compensation activation signal ACPV when an error detection rate exceeds a predetermined rate.

In response to the pass voltage compensation activation signal ACPV, the word line voltage generator 920 may output, to the row decoder 940, a read voltage Vread, which is temperature-compensated according to the voltage generation control signal CVG, or may output, to the row decoder 940, a read voltage Vread and a pass voltage Vpass, which are temperature-compensated according to the voltage generation control signal CVG.

The memory cell array 930 may include a plurality of word lines and a plurality of bit lines, and may also include a plurality of memory cells connected to the word lines and the bit lines. The memory cell array 930 may, for example, be a NAND-type. Each of the memory cells may, for example, be a multi-level memory cell having n threshold voltage levels.

In response to a row address, the row decoder 940 may apply a read voltage Vread to a selected word line when only the read voltage Vread is applied to the row decoder 940, and may apply a read voltage Vread to the selected word line and a pass voltage Vpass to all or specific ones of unselected word lines when the read voltage Vread and the pass voltage Vpass are applied to the row decoder 940.

The sense amplifier and write driver circuit 950 may be configured to read data from the memory cell array 930 during a read operation, and configured to write data in the memory cell array 930 during a program operation.

The column decoder 960 may be configured to select data read by the sense amplifier and write driver circuit 950 in predetermined units (e.g., byte units).

The error correction circuit 970 may detect whether or not an error has occurred in the data selected by the column decoder 960, and correct the detected error. When an error has occurred, the error correction circuit 970 may output an error detection signal ED including information regarding the bit number of the selected data and information regarding the number of error bits.

The I/O interface 980 may externally transmit data passing through the error correction circuit 970.

The control logic 910, the word line voltage generator 920, the row decoder 940, and the error correction circuit 970 may constitute a word line voltage application unit 901, which may, in a first mode, apply a temperature-compensated read voltage Vread to a selected word line, and may, in a second mode, apply the temperature-compensated read voltage Vread to the selected word line and a temperature-compensated pass voltage to unselected word lines during a program verification read operation or a normal read operation.

Figure 10:
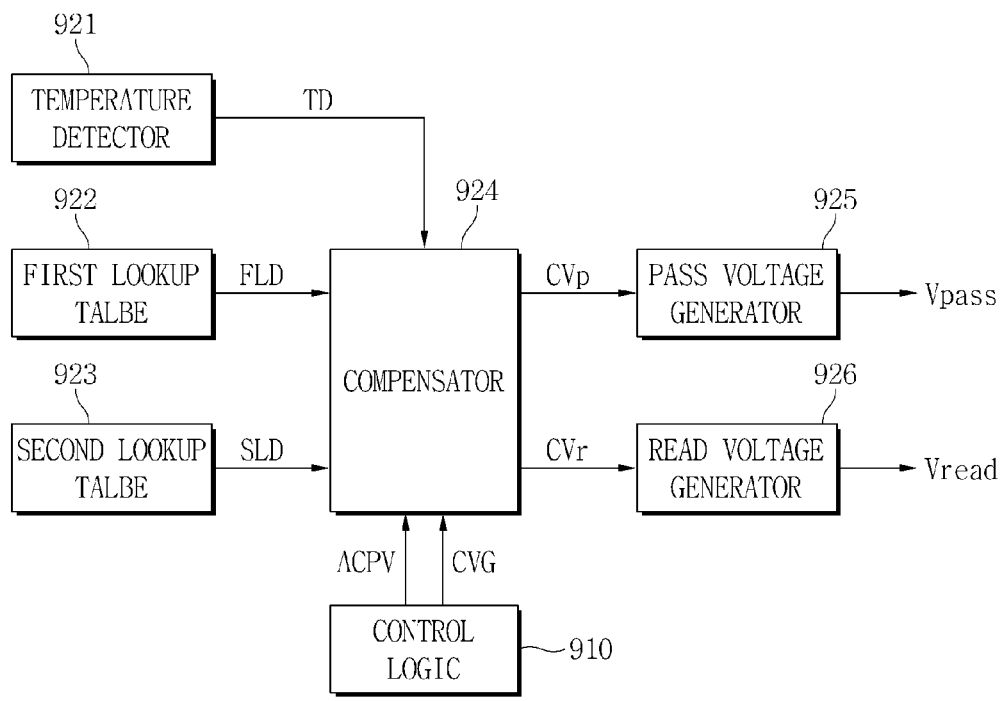
FIG. 10 is a schematic block diagram illustrating a word line voltage generator of FIG. 9.

FIG. 10 is a schematic block diagram illustrating word line voltage generator 920 of FIG. 9.

Referring to FIG. 10, the word line voltage generator 920 may include a temperature detector 921, a first lookup table 922, a second lookup table 923, a compensator 924, a pass voltage generator 925, and a read voltage generator 926.

Since the temperature detector 921, the first lookup table 922, the second lookup table 923, the pass voltage generator 925, and the read voltage generator 926 are the same as described with reference to FIG. 6, a description thereof is omitted.

The compensator 924 may receive temperature data TD from the temperature detector 921.

When the compensator 924 receives a pass voltage compensation activation signal ACPV from the control logic 910, the compensator 924 may read first temperature compensation data FLD, corresponding to the temperature data TD, from the first lookup table 922, and may read second temperature compensation data SLD, corresponding to the temperature data TD, from the second lookup table 923.

In an embodiment, in response to the voltage generation control signal CVG output by the control logic 910, the compensator 924 may output a pass voltage compensation signal CVp, corresponding to the first temperature compensation data FLD, as a constant value irrespective of threshold voltage levels of memory cells, and may sequentially output read voltage compensation signals CVr, corresponding to the second temperature compensation data SLD, in the order of the threshold voltage levels.

In an embodiment, in response to the voltage generation control signal CVG output by the control logic 910, the compensator 924 may sequentially output pass voltage compensation signals CVp, corresponding to the first temperature compensation data FLD, in the order of the threshold voltage levels, and may sequentially output read voltage compensation signals CVr, corresponding to the second temperature compensation data SLD, in the order of the threshold voltage levels. For example, in response to the voltage generation control signal CVG, after the compensator 924 outputs a pass voltage compensation signal CVp and a read voltage compensation signal CVr corresponding to a first level, the compensator 924 may output a pass voltage compensation signal CVp and a read voltage compensation signal CVr corresponding to a second level. In the above-described manner, the compensator 924 may output the pass voltage compensation signal CVp and the read voltage compensation signal CVr corresponding to the first level and may continue sequentially through increasing level orders until the compensator 924 may output a pass voltage compensation signal CVp and a read voltage compensation signal CVr corresponding to an n-th level.

When the compensator 924 does not receive the pass voltage compensation activation signal ACPV from the control logic 910, the compensator 924 may read only the second temperature compensation data SLD corresponding to temperature data from the second lookup table 923. In this case, the compensator 924 may, in response to the voltage generation control signal CVG output by the control logic 910, sequentially output only the read voltage compensation signals CVr corresponding to the second temperature compensation data SLD in the order of the threshold voltage levels.

Figure 11:
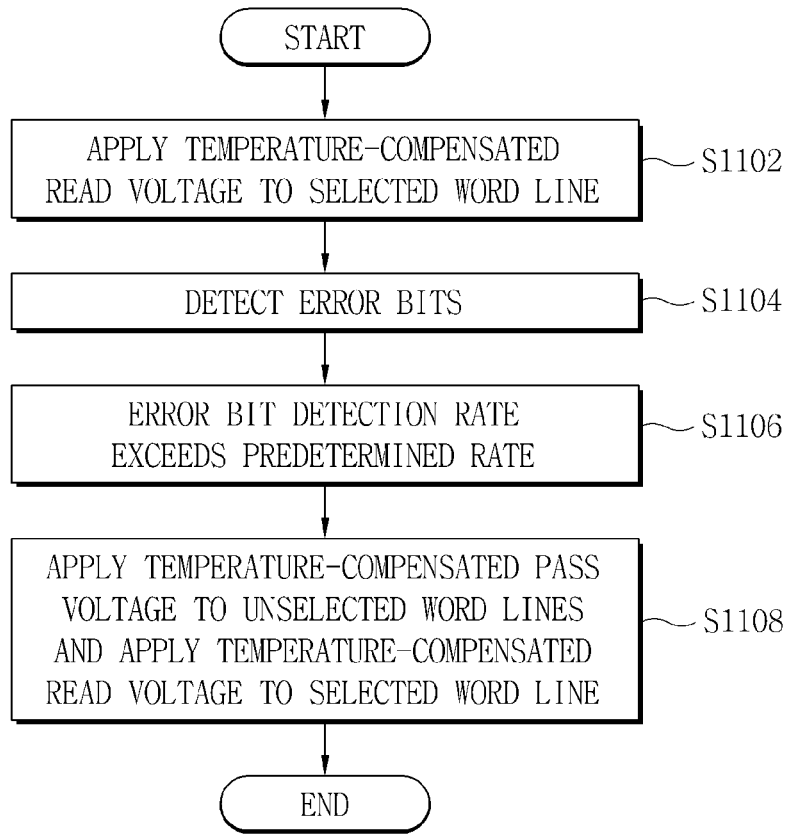
FIG. 11 is a flowchart illustrating a method of applying a word line voltage to a word line during a read operation, according to an embodiment of the inventive concept.

FIG. 11 is a flowchart illustrating a method of applying a word line voltage to a word line during a read operation, according to an embodiment of the inventive concept.

Referring to FIGS. 9, 10, and 11, initially, the word line voltage generator 920 may sequentially output temperature-compensated read voltages Vread corresponding to respective levels, and the row decoder 940 may sequentially apply the temperature-compensated read voltages Vread to a selected word line (operation S1102).

Next, the error correction circuit 970 may detect error bits in memory data read from a memory cell connected to the selected word line (operation S1104).

Next, the control logic 910 may output a pass voltage compensation activation signal ACPV when an error bit detection rate is equal to or higher than a predetermined rate (operation S1106).

Next, the word line voltage generator 920 may output a temperature-compensated pass voltage Vpass and a temperature-compensated read voltage Vread in response to the pass voltage compensation activation signal ACPV. Also, the row decoder 940 may apply the temperature-compensated read voltage Vread to the selected word line, and apply the temperature-compensated pass voltage Vpass to unselected word lines (operation S1108).

Since operation S1108 is described above with reference to FIGS. 7 and 8, a detailed description thereof is omitted.

Figure 12:
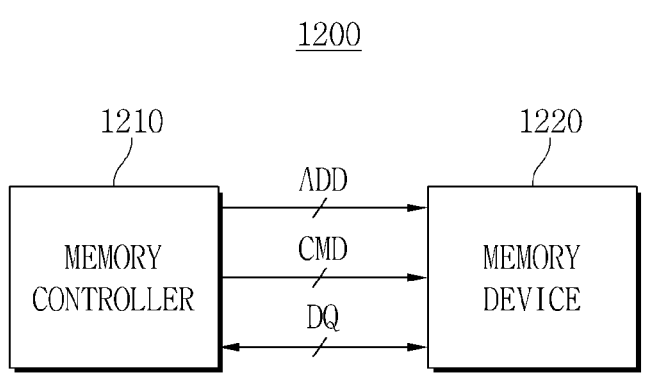
FIG. 12 is a block diagram of an example of a memory system including a memory device, according to an embodiment of the inventive concept.

FIG. 12 is a block diagram of an example of a memory system 1200 including a memory device 1220, according to an embodiment of the inventive concept.

Referring to FIG. 12, the memory system 1200 may include a memory controller 1210 and the memory device 1220.

The memory controller 1210 may generate an address signal ADD and a command CMD, and provide the address signal ADD and the command CMD to the memory device 1220 through buses. Data DQ may be transmitted from the memory controller 1210 to the memory device 1220 through the buses, or transmitted from the memory device 1220 to the memory controller 1210 through the buses.

The memory device 1220 may be a semiconductor memory device, according to an embodiment of the inventive concept.

Figure 13:
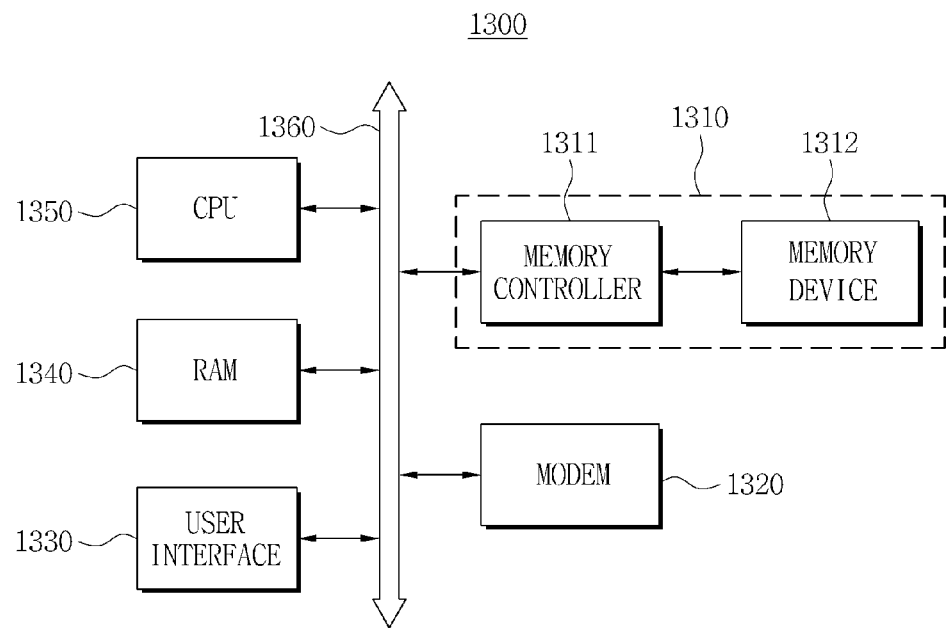
FIG. 13 is a block diagram of an example of a computer system including a memory device, according to an embodiment of the inventive concept.

FIG. 13 is a block diagram of an example of a computer system 1300 including a memory device 1312, according to an embodiment of the inventive concept.

Referring to FIG. 13, the memory device 1312, according to an embodiment of the inventive concept, may be mounted in the computer system 1300, such as, for example, a mobile device or a desktop computer. The computer system 1300 may include a memory system 1310, a modem 1320, a central processing unit (CPU) 1350, a random access memory (RAM) 1340, and a user interface 1330, which may be electrically connected to a system bus 1360.

The memory system 1310 may include a memory controller 1311 and the memory device 1312. Data processed by the CPU 1350 or externally input data may be stored in memory device 1312. The memory device 1312 may be a semiconductor memory device, according to embodiments of the inventive concept.

Although not shown in FIG. 13, it would be apparent to one of ordinary skill that an application chipset, a camera image processor (CIP), and an input/output (I/O) device may be further provided in the computer system 1300.

Figure 14:
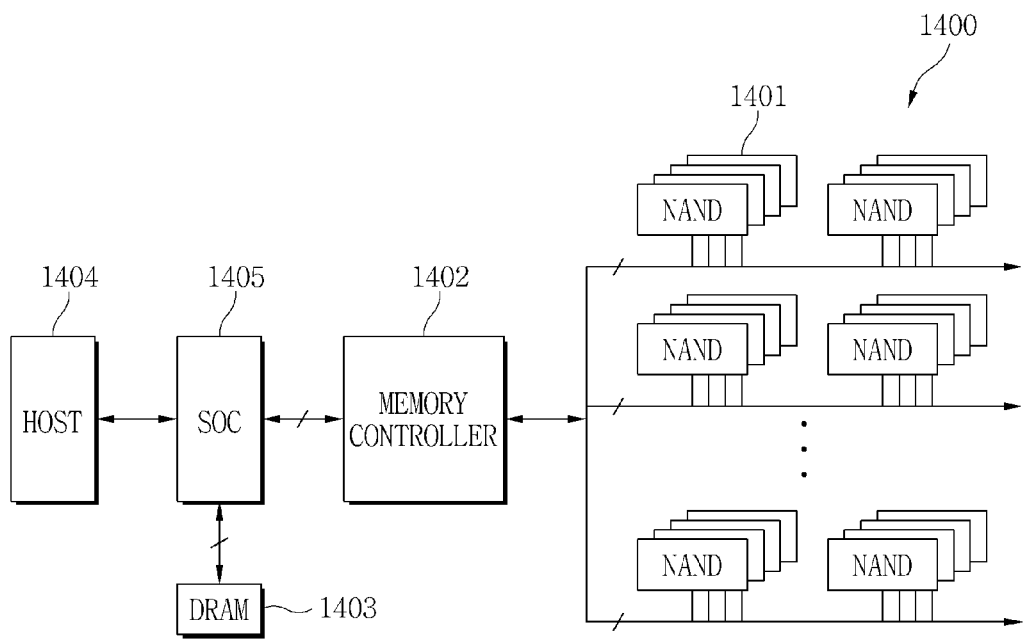
FIG. 14 is a diagram of another example of a memory system including a memory device, according to an embodiment of the inventive concept.

FIG. 14 is a diagram of another example of a memory system 1400 including a memory device 1401, according to an embodiment of the inventive concept. Referring to FIG. 14, the memory system 1400 may be embodied by a data processing device, such, for example, as a solid-state drive (SSD).

The memory system 1400 may include a plurality of memory devices 1401, a memory controller 1402 configured to control a data processing operation of each of the plurality of memory devices 1401, a non-volatile memory device 1403 (e.g., a dynamic random access memory (DRAM)), and a system-on-a-chip (SOC) 1405 configured to control storage of data transmitted and received between the memory controller 1402 and a host 1404 in the non-volatile memory device 1403. Here, each of the memory devices 1401 may be a semiconductor memory device, according to an embodiment of the inventive concept.

The inventive concept may be applied to a semiconductor memory device, particularly, a semiconductor memory device configured to generate a temperature-compensated word line voltage.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can be transmitted through carrier waves or signals (e.g., wired or wireless data transmission through the Internet). Also, functional programs, codes, and code segments to accomplish the present general inventive concept can be easily construed by programmers skilled in the art to which the present general inventive concept pertains.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a memory cell array including a plurality of word lines and a plurality of non-volatile memory cells connected to the word lines; and
a word line voltage application unit configured to apply a temperature-compensated read voltage to a selected word line of the plurality of word lines, and to apply a temperature-compensated pass voltage to at least one unselected word line of the plurality of word lines during a read operation,
wherein at least one of the plurality of non-volatile memory cells has a plurality of threshold voltage levels, and
the word line voltage application unit is configured to apply temperature-compensated pass voltages corresponding to respective threshold voltage levels.

2. The device of claim 1, wherein the word line voltage application unit comprises:
a word line voltage generator configured to detect a temperature and output the temperature-compensated read voltage and the temperature-compensated pass voltage corresponding to the temperature; and
a row decoder configured to apply the read voltage to the selected word line, and to apply the pass voltage to the at least one unselected word line.

3. The device of claim 2, wherein the word line voltage generator comprises:
a temperature detector configured to detect the temperature;
a first lookup table configured to store first temperature compensation data for temperature-compensating the pass voltage according to the temperature;
a second lookup table configured to store second temperature compensation data for temperature-compensating the read voltage according to the temperature;
a compensator configured to read the first temperature compensation data and the second temperature compensation data corresponding to the temperature, and to output a pass voltage compensation signal corresponding to the first temperature compensation data and a read voltage compensation signal corresponding to the second temperature compensation data;
a pass voltage generator configured to output the pass voltage corresponding to the pass voltage compensation signal; and
a read voltage generator configured to output the read voltage corresponding to the read voltage compensation signal.

4. The device of claim 3, wherein:
at least one of the plurality of non-volatile memory cells has n threshold voltage levels;
the second temperature compensation data are set at respective levels; and
the compensator is configured to output the read voltage compensation signal in a sequence starting with the read voltage compensation signal corresponding to a first-level second temperature compensation data and ending with the read voltage compensation signal corresponding to an n-th-level second temperature compensation data.

5. The device of claim 3, wherein:
at least one of the plurality of non-volatile memory cells has n threshold voltage levels;
the first temperature compensation data are set at first respective levels; and
the second temperature compensation data are set at second respective levels; and
the compensator is configured to output the pass voltage and the read voltage in a sequence starting with the pass voltage compensation signal corresponding to a first-level first temperature compensation data and the read voltage compensation signal corresponding to a first-level second temperature compensation data and ending with the pass voltage compensation signal corresponding to and n-th-level first temperature compensation data and the read voltage compensation signal corresponding to and n-th-level second temperature compensation data.

6. The device of claim 1, wherein:
at least one of the plurality of non-volatile memory cells has n threshold voltage levels;
the temperature-compensated read voltage is a plurality of temperature-compensated read voltages; and
the word line voltage application unit is configured to apply the temperature-compensated read voltages in a sequence starting with a temperature-compensated first-level read voltage and ending with a temperature-compensated n-th-level read voltage.

7. The device of claim 1, wherein:
at least one of the plurality of non-volatile memory cells has n threshold voltage levels; and
the word line voltage application unit is configured to apply the temperature-compensated read voltage and the temperature-compensated pass voltage in a sequence starting with a temperature-compensated first-level read voltage and a temperature-compensated first-level pass voltage and ending with a temperature-compensated n-th-level read voltage and a temperature-compensated n-th-level pass voltage.

8. The device of claim 1, wherein the memory cell array includes a NAND-type flash memory cell array.

9. A semiconductor memory device, comprising:
a memory cell array comprising a plurality of word lines and a plurality of non-volatile memory cells connected to the plurality of word lines; and
a word line voltage application unit configured to apply, in a first mode, a temperature-compensated read voltage to a selected word line of the plurality of word lines, and to apply, in a second mode during a read operation, the temperature-compensated read voltage to the selected word line of the plurality of word lines and a temperature-compensated pass voltage to at least one unselected word line of the plurality of word lines,
wherein the first mode is a state in which an error detection rate of read data is less than a predetermined rate, and
the second mode is a state in which the error detection rate of the read data is equal to or more than the predetermined rate.

10. The device of claim 9, wherein the word line voltage application unit comprises:
an error correction circuit configured to detect errors from the read data;
a word line voltage generator configured to detect a temperature, to output, in the first mode, a temperature-compensated read voltage corresponding to the temperature, and to output, in the second mode, the temperature-compensated read voltage and a temperature-compensated pass voltage corresponding to the temperature; and
a row decoder configured to apply the temperature-compensated read voltage to the selected word line, and to apply the temperature-compensated pass voltage to the at least one unselected word line.

11. The device of claim 9, wherein:
- at least one of the plurality of non-volatile memory cells has n threshold voltage levels; and
- the word line voltage application unit is configured to apply, in the first mode, the temperature-compensated read voltage in a first sequence starting with a temperature-compensated first-level read voltage and ending with a temperature-compensated n-th-level read voltage.

12. The device of claim 11, wherein the word line voltage application unit is configured to apply, in the second mode, the temperature-compensated read voltage in the first sequence.

13. The device of claim 11, wherein the word line voltage application unit is configured to apply, in the second mode, the temperature-compensated read voltage in the first sequence and the temperature-compensated pass voltage in a second sequence starting with a temperature-compensated first-level pass voltage and ending with a temperature-compensated n-th-level pass voltage.

14. The device of claim 9, wherein the memory cell array includes a NAND-type flash memory cell array.

15. A method of performing a read operation, the method comprising:
- applying, from a circuit during the read operation, a read voltage to a selected word line of a multi-level memory cell, wherein the read voltage is compensated for a temperature of the multi-level memory cell; and
- applying, from the circuit during the read operation, a pass voltage to at least one unselected word line of the multi-level memory cell, wherein the pass voltage is compensated for the temperature,
- wherein the applying the pass voltage comprises applying the pass voltage if a rate of error bits in data from the multi-level memory cell exceeds a predetermined rate.

16. The method as claimed in claim 15, further comprising:
- producing, at the circuit, the read voltage from a temperature-compensated read voltage signal;
- producing, at the circuit, the temperature-compensated read voltage signal from first temperature compensation data corresponding to the temperature and a threshold voltage corresponding to the multi-level memory cell;
- producing, at the circuit, the pass voltage from a temperature-compensated pass voltage signal; and
- producing, at the circuit, the temperature-compensated pass voltage signal from second temperature compensation data corresponding to the temperature.

17. The method as claimed in claim 15, wherein:
- the read voltage comprises a first read voltage corresponding to a first level of the multi-level memory cell and a second read voltage corresponding to a second level of the multi-level memory cell; and
- the applying the read voltage comprises applying, in a sequence, the first read voltage followed by the second read voltage.

18. The method as claimed in claim 17, wherein:
- the pass voltage comprises a first pass voltage corresponding to the first level and a second pass voltage corresponding to the second level; and
- the applying the pass voltage comprises applying, in the sequence, the first pass voltage followed by the second pass voltage.

* * * * *